(12) United States Patent
Fukui

(10) Patent No.: US 9,957,637 B2
(45) Date of Patent: May 1, 2018

(54) METHOD OF PRODUCING EPITAXIAL WAFER

(71) Applicant: SUMCO CORPORATION, Tokyo (JP)

(72) Inventor: Akira Fukui, Saga (JP)

(73) Assignee: SUMCO CORPORATION, Tokyo (JP)

( * ) Notice: Subject to any disclaimer, the term of this patent is extended or adjusted under 35 U.S.C. 154(b) by 44 days.

(21) Appl. No.: 14/896,981

(22) PCT Filed: May 13, 2014

(86) PCT No.: PCT/JP2014/002513
§ 371 (c)(1),
(2) Date: Dec. 9, 2015

(87) PCT Pub. No.: WO2014/199560
PCT Pub. Date: Dec. 18, 2014

(65) Prior Publication Data
US 2016/0122904 A1 May 5, 2016

(30) Foreign Application Priority Data
Jun. 10, 2013 (JP) ................................ 2013-121845

(51) Int. Cl.
*C30B 25/02* (2006.01)
*C30B 25/16* (2006.01)
(Continued)

(52) U.S. Cl.
CPC .............. *C30B 25/16* (2013.01); *C23C 16/52* (2013.01); *C30B 29/06* (2013.01); *C30B 33/00* (2013.01);
(Continued)

(58) Field of Classification Search
CPC .......... C30B 25/02; C30B 25/16; C30B 33/08
See application file for complete search history.

(56) References Cited

U.S. PATENT DOCUMENTS 8,196,545 B2 * 6/2012 Kurosawa ............... H01L 22/12
118/708
8,409,349 B2 4/2013 Ohkubo
(Continued)

FOREIGN PATENT DOCUMENTS

JP  2002-043230 A  2/2002
JP  2007-142326 A  6/2007
(Continued)

OTHER PUBLICATIONS

Search Report issued by WIPO patent office in PCT/JP2014/002513, dated Aug. 19, 2014.
(Continued)

*Primary Examiner* — Robert M Kunemund
(74) *Attorney, Agent, or Firm* — Greenblum & Bernstein, P.L.C.

(57) ABSTRACT

A method of adjusting conditions for epitaxial growth includes a first measurement step for measuring the thickness profile of a wafer before forming an epitaxial film; a second measurement step for measuring the thickness profile of an epitaxial wafer and the film thickness profile of the epitaxial film after an epitaxial growth step before a polishing step; a third measurement step for measuring the thickness profile of an epitaxial wafer and the film thickness profile of an epitaxial film; and a step for adjusting conditions for epitaxial growth using the thickness profiles and the film thickness profiles measured in the first, second, and third measurement steps.

7 Claims, 7 Drawing Sheets

(51) Int. Cl.
  *C23C 16/52* (2006.01)
  *C30B 29/06* (2006.01)
  *C30B 33/00* (2006.01)
  *H01L 21/306* (2006.01)
  *H01L 21/66* (2006.01)
  *H01L 21/02* (2006.01)

(52) U.S. Cl.
  CPC .... *H01L 21/0262* (2013.01); *H01L 21/02381* (2013.01); *H01L 21/02532* (2013.01); *H01L 21/02576* (2013.01); *H01L 21/02579* (2013.01); *H01L 21/30625* (2013.01); *H01L 22/12* (2013.01); *H01L 22/20* (2013.01)

(56) References Cited

U.S. PATENT DOCUMENTS

| | | | |
|---|---|---|---|
| 8,815,710 | B2 | 8/2014 | Ishibashi et al. |
| 9,123,759 | B2 | 9/2015 | Miyashita |
| 2009/0269861 | A1 | 10/2009 | Kurosawa |
| 2010/0029066 | A1 | 2/2010 | Miyashita |
| 2011/0031592 | A1 | 2/2011 | Ishibashi et al. |

FOREIGN PATENT DOCUMENTS

| | | |
|---|---|---|
| JP | 2010-171330 A | 8/2010 |
| JP | 2011-023422 A | 2/2011 |
| JP | 2011-044491 A | 3/2011 |
| TW | 201001589 A | 1/2010 |
| TW | 201003743 A | 1/2010 |
| WO | 2009/150896 A1 | 12/2009 |

OTHER PUBLICATIONS

Office Action issued in Taiwanese family member Patent Appl. No. 103111655, dated Dec. 8, 2015, along with an english translation thereof.

Office Action issued in Japan Family member Patent Appl. No. 2013-121845, dated Aug. 16, 2016, along with an English translation thereof.

Chinese Office Action issued with respect to Application No. 2014800331553, dated Sep. 8, 2017.

Office Action issued in China family member Patent Appl. No. 201480033155.3, dated Mar. 10, 2017, along with an English translation thereof.

Office Action issued in Republic of Korea family member Patent Appl. No. 10-2015-7035082, dated Feb. 27, 2017, along with an English translation thereof.

* cited by examiner

METHOD OF PRODUCING EPITAXIAL WAFER

TECHNICAL FIELD

This disclosure relates to a method of adjusting conditions for epitaxial growth for obtaining an epitaxial wafer by forming an epitaxial film on the top surface of a wafer and polishing the surface of the epitaxial film. This disclosure also relates to a method of producing an epitaxial wafer using the conditions for epitaxial growth adjusted by the adjusting method.

BACKGROUND

An epitaxial wafer is obtained by forming an epitaxial film by blowing a source gas onto one of the surfaces of a wafer to be a substrate. Such epitaxial wafers are used for the wide applications of semiconductor devices such as memory devices, logic devices, and imaging devices. It is known that while an epitaxial film is formed on the top surface of such a wafer, a slight source gas reaches the rear surface of the wafer and a deposit is unavoidably formed on an end portion of the rear surface of the wafer. Note that in this specification, as described above, one of the surfaces of a wafer on which an epitaxial film is formed is referred to as "top surface", whereas the surface opposite to the top surface is referred to as "rear surface".

In order to improve the integration degree of those semiconductor devices, the flatness of epitaxial wafers is a major factor. Accordingly, there is a demand for epitaxial wafers with high quality and high flatness. In view of the above, for the purpose of reducing the surface roughness of an epitaxial wafer and removing the deposit on the end portion of the rear surface of the wafer, both surfaces of the epitaxial wafer are sometimes polished after the formation of the epitaxial film.

JP 2011-023422 A (PTL 1) describes a technique of determining conditions for polishing an epitaxial wafer that are suitable for the amount of the deposit formed on the end portion of the rear surface of the wafer. The amount of the deposit is determined based on the flatness of the wafer before the formation of the epitaxial film, the flatness of the epitaxial wafer after the formation of the epitaxial film, and the film thickness profile of the epitaxial film. In PTL 1 states that an epitaxial wafer with high flatness can be obtained by polishing an epitaxial wafer under the polishing conditions determined as described above. Accordingly, the technique of PTL 1 is a technique of determining polishing conditions after the formation of an epitaxial film, so that the conditions can be optimized for the epitaxial film having been formed.

CITATION LIST

Patent Literature

PTL 1: JP 2011-023422 A

SUMMARY

Technical Problem

The method of PTL 1 is preferred in that the deposit formed on the rear surface of a wafer can be removed by polishing. However, according to the studies by the inventor of the present invention, polishing after the formation of an epitaxial film results in insufficient control of the removal film thickness profile of the epitaxial film. Therefore, although an epitaxial wafer is polished by determining the polishing conditions as in PTL 1, there remains room for improvement in the flatness of the whole epitaxial wafer, i.e., uniformity in the thickness profile of the epitaxial wafer.

To address the above problem, it could be helpful to provide a method of adjusting conditions for epitaxial growth, which makes it possible to obtain an epitaxial wafer with higher flatness even if a surface of an epitaxial film is polished after the formation of the epitaxial film. It could also be helpful to provide a method of producing an epitaxial wafer using the conditions for epitaxial growth adjusted by the adjusting method, which method makes it possible to obtain an epitaxial wafer with higher flatness.

Solution to Problem

With a view to addressing the above challenges, the inventor made various studies, thereby obtaining the following findings. That is, polishing the surface of an epitaxial film after adjusting conditions for epitaxial growth allows better control of the film thickness profile of the epitaxial film having been polished than polishing the surface of an epitaxial film after adjusting polishing conditions. Accordingly, the inventor found that in order to obtain an epitaxial wafer with higher flatness, the conditions for epitaxial growth which make it possible to obtain an epitaxial wafer having higher flatness can be adjusted by taking into account the removal film thickness profile associated with polishing of the epitaxial film having been formed. The inventor also found that the use of the conditions for epitaxial growth that have been adjusted as described above can increase the flatness of the epitaxial wafer in which the surface of the epitaxial film has been polished.

Based on the above findings, we provide:

a method of adjusting the conditions for epitaxial growth, for adjusting conditions for epitaxial growth in obtaining an epitaxial wafer through an epitaxial growth step for forming an epitaxial film on a top surface of a wafer, and a polishing step for polishing a surface of the epitaxial film after the epitaxial growth step, the epitaxial growth step comprising:

a first measurement step for measuring a thickness profile of the wafer before the formation of the epitaxial film;

a second measurement step for measuring a thickness profile of the epitaxial wafer and a film thickness profile of the epitaxial film after the epitaxial growth step and before the polishing step;

a third measurement step for measuring a thickness profile of the epitaxial wafer and a film thickness profile of the epitaxial film after the polishing step; and a step for adjusting conditions for epitaxial growth using the thickness profiles and the film thickness profiles measured in the first, second, and third measurement steps.

In that case, preferably, in the step for adjusting conditions for epitaxial growth, a removal thickness profile of the epitaxial wafer associated with the polishing is calculated by performing a comparison operation on the thickness profile measured in the second measurement step and the thickness profile measured in third measurement step, a removal film thickness profile of the epitaxial film associated with the polishing is calculated by performing a comparison operation on the film thickness profile measured in the second measurement step and the film thickness profile measured in the third measurement step, based on the calculated removal thickness profile and the removal film thickness profile, a removal thickness profile of the epitaxial film side of the epitaxial wafer and a removal thickness profile of the rear surface side of the epitaxial wafer, associated with the polishing are calculated, and based at least on the removal thickness profile of the epitaxial film side of the epitaxial wafer associated with the polishing and the thickness profile of the wafer before the formation of the epitaxial film, conditions for epitaxial growth in the epitaxial growth step are adjusted, whereby obtaining an epitaxial wafer having a target thickness profile after the polishing step.

Further, for the disclosed method of adjusting conditions for epitaxial growth, in the step for adjusting conditions for epitaxial growth, the film thickness profile of the epitaxial film is preferably adjusted.

Still further, for the disclosed method of adjusting conditions for epitaxial growth, in the polishing step, both the surface of the epitaxial film and the rear surface of the epitaxial wafer are preferably polished.

In that case, both the surfaces are preferably polished simultaneously.

Yet further, in a method of producing an epitaxial wafer. an epitaxial film is formed on a top surface of a wafer of the same type as the aforementioned wafer on which the epitaxial film has not been formed using the conditions for epitaxial growth adjusted by the above adjusting method, and a surface of the epitaxial film on the top surface of the wafer of the same type is polished under polishing conditions the same as those in the polishing step.

Further, in the method of producing an epitaxial wafer, epitaxial growth is preferably performed on a (110) plane of the wafer and the wafer of the same type.

Advantageous Effect

We can provide a method of adjusting conditions for epitaxial growth which makes it possible to obtain an epitaxial wafer with higher flatness by considering a removal film thickness profile of an epitaxial film associated with polishing. Further, we can provide a method of producing an epitaxial wafer, by which sagging of the epitaxial wafer caused by polishing after the polishing of the epitaxial wafer after the formation of the epitaxial film is suppressed using the conditions for epitaxial growth that have been adjusted by the disclosed adjusting method, thereby obtaining an epitaxial wafer with higher flatness.

BRIEF DESCRIPTION OF THE DRAWINGS

In the accompanying drawings:

FIGS. 5(A) to 5(C) are graphs showing the thickness profiles in Example 1, in which FIG. 5(A) is a graph showing the thickness profile (PV value profile) of a wafer before the formation of an epitaxial film, FIG. 5(B) is a graph showing the thickness profile (PV value profile) of an epitaxial wafer after the formation of an epitaxial film and before polishing, and FIG. 5(C) is a graph showing the thickness profile (PV value profile) of the epitaxial wafer after the polishing;

FIGS. 6(A) to 6(C) are graphs showing the thickness profiles in Example 2, in which FIG. 6(A) is a graph showing the thickness profile (PV value profile) of a wafer before the formation of an epitaxial film, FIG. 6(B) is a graph showing the thickness profile (PV value profile) of an epitaxial wafer after the formation of an epitaxial film and before polishing, and FIG. 6(C) is a graph showing the thickness profile (PV value profile) of the epitaxial wafer after the polishing; and FIGS. 7(A) to 7(C) are graphs showing the thickness profiles in Comparative Example, in which FIG. 7(A) is a graph showing the thickness profile (PV value profile) of a wafer before the formation of an epitaxial film, FIG. 7(B) is a graph showing the thickness profile (PV value profile) of an epitaxial wafer after the formation of an epitaxial film and before polishing, and FIG. 7(C) is a graph showing the thickness profile (PV value profile) of the epitaxial wafer after the polishing.

DETAILED DESCRIPTION

Embodiment 1: Method of Adjusting Conditions for Epitaxial Growth

A method of adjusting conditions for epitaxial growth according to one embodiment will now be described with reference to the drawings. In this embodiment, for the sake of explanation, a wafer used to adjust the conditions for epitaxial growth is referred to as "adjusting wafer", and an epitaxial wafer obtained by forming an epitaxial film on the top surface of the wafer is referred to as "adjusting epitaxial wafer". This, however, is not intended to limit the uses of a wafer and an epitaxial wafer.

Figure 1:
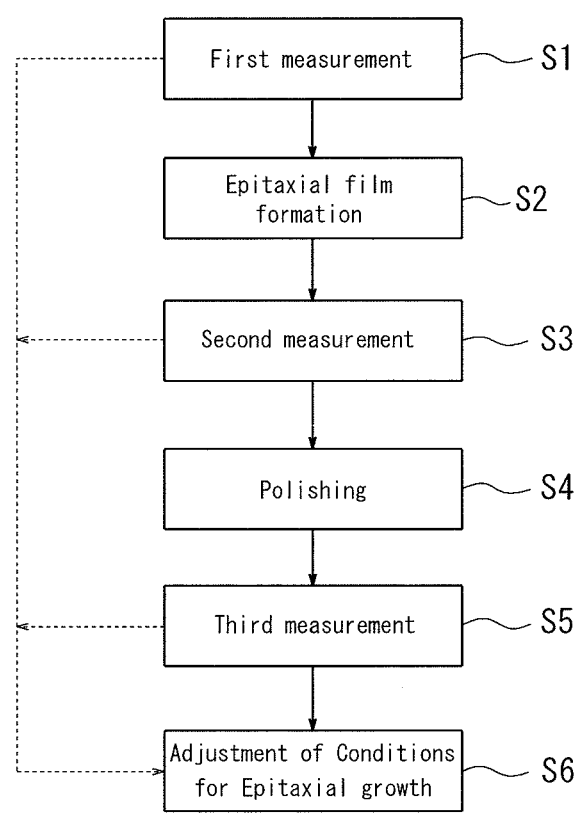
FIG. 1 is a flowchart illustrating a method of adjusting conditions for epitaxial growth according to Embodiment 1.
Figure 2:
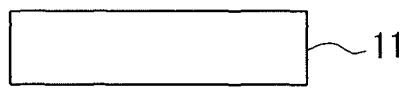
FIGS. 2(A) to 2(F) are schematic cross-sectional views of a wafer and an epitaxial wafer, illustrating a method of adjusting conditions for epitaxial growth according to Embodiment 1 and a method of producing an epitaxial wafer according to Embodiment 2.
Figure 2:
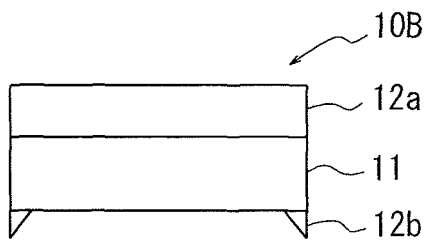
Figure 2:
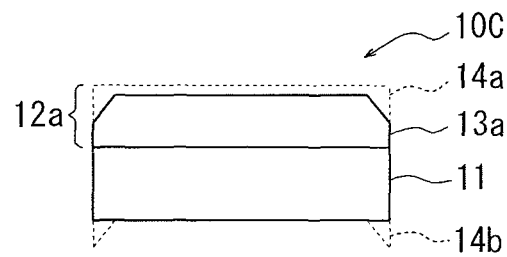
Figure 2:
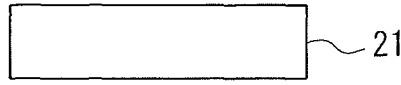
Figure 2:
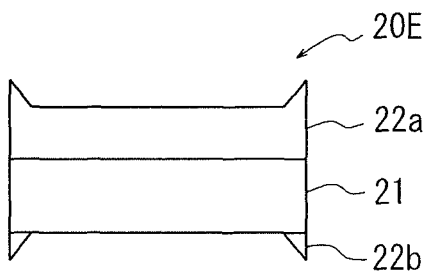
Figure 2:
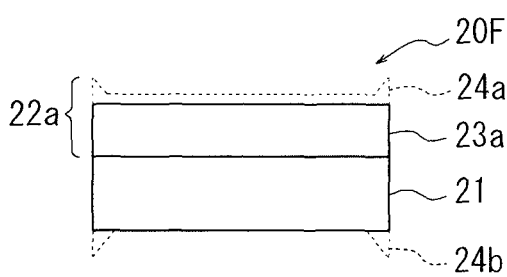

First, with reference to FIG. 1 and FIGS. 2(A) to 2(F), an outline of the method of adjusting the conditions for epitaxial growth according to Embodiment 1 will be described (the steps will later be described in detail). The method of adjusting the conditions for epitaxial growth is for adjusting conditions for epitaxial growth in obtaining an epitaxial wafer through an epitaxial growth step for forming an epitaxial film on a top surface of a wafer, and a polishing step for polishing a surface of the epitaxial film after the epitaxial growth step. The epitaxial growth step includes the following steps. Specifically, the method of adjusting conditions for epitaxial growth according to one embodiment includes: a first measurement step for measuring a thickness profile of an adjusting wafer 11 (FIG. 2(A))(FIG. 1, S1); a second measurement step for measuring a thickness profile of an adjusting epitaxial wafer 10B (FIG. 2(B)) having been obtained by (after) forming an epitaxial film 12a on the top surface of the adjusting wafer 11 (FIG. 1, S2) and a film thickness profile of the epitaxial film 12a (FIG. 1, S3); a polishing step for polishing the adjusting epitaxial wafer 10B (FIG. 1, S4); a third measurement step for measuring a thickness profile of an epitaxial wafer 10C after polishing (FIG. 2(C)) and a film thickness profile of the epitaxial film 13a (FIG. 1, S5); and a step for adjusting conditions for epitaxial growth using the thickness profiles and the film thickness profiles measured in the first, second, and third measurement steps (FIG. 1, S6).

(S1)

In the first measurement step (S1), the thickness profile of the adjusting wafer 11 is measured. The measurement result is used in the step S6 for adjusting conditions for epitaxial growth. The thickness profile of the adjusting wafer 11 can be measured by a given technique, for example, can be measured using a flatness measurement system (WaferSight manufactured by KLA-Tencor).

(S2)

In the subsequent epitaxial growth step (S2), a source gas is blown onto the top surface of the adjusting wafer 11, thereby forming the epitaxial film 12*a*. Given conditions can be used as the conditions for epitaxial growth in the step S2. In this embodiment, the conditions for epitaxial growth are determined such that the epitaxial film 12*a* to be formed becomes as flat as possible (to form a uniform plane). At that time, the source gas slightly reaches the rear surface of the adjusting wafer 11, so that a deposit 12*b* is formed on an end portion of the adjusting wafer 11 (FIG. 2(B)).

More specifically, the epitaxial film 12*a* can be formed as follows, although the method of forming the epitaxial film 12*a* is not limited thereto. First, the adjusting wafer 11 is transversely placed horizontally in a susceptor. Next, in order to remove native oxide films or particles on the top surface of the adjusting wafer 11, hydrogen gas is supplied into a chamber, and hydrogen baking is performed, for example at a temperature of approximately 1150° C. for approximately 60 s. After that, a carrier gas ($H_2$ gas), a silicon source gas (such as silicon tetrachloride, monosilane ($SiH_4$), TCS ($SiHCl_3$), or dichlorosilane ($SiH_2Cl_2$)), and a dopant gas (such as diborane ($B_2H_6$) or phosphine ($PH_3$)) are supplied into the chamber to perform epitaxial growth typically at a source gas rate of 1 L/min to 50 L/min on the top surface of the adjusting wafer 11 heated at a chamber temperature of 1000° C. to 1150° C. Thus, an epitaxial film can be formed to a film thickness of approximately 1 μm to 20 μm depending on the growth time. An epitaxial film can be formed in the same manner in the formation of the epitaxial film in Embodiment 2 described later.

(S3)

In the second measurement step (S3) after the step S2, the thickness profile of the adjusting epitaxial wafer 10B and the film thickness profile of the epitaxial film 12*a* are measured. The film thickness profile of the epitaxial film 12*a* can be measured by a given technique, for example, can be measured using a Fourier transform infrared spectrophotometer (FTIR). Further, the thickness profile of the adjusting epitaxial wafer 10B can be measured, for example, using a flatness measurement system as with the step S1. The results of the second measurement are used in the step S6 for adjusting conditions for epitaxial growth.

(S4)

In the subsequent polishing step (S4), both surfaces of the adjusting epitaxial wafer 10B are simultaneously polished. FIG. 2(C) shows the adjusting epitaxial wafer 10C after polishing. The adjusting epitaxial wafer 10C has the adjusting wafer 11 serving as a substrate and an epitaxial film 13*a* after polishing, which is formed on the top surface of the adjusting wafer. The portion indicated by the broken lines, that is, the epitaxial film 12*a* before polishing from which the epitaxial film 13*a* after polishing is removed is a removal thickness profile 14*a* of the epitaxial film side (also simply referred to as "top surface" of the epitaxial wafer) of the adjusting epitaxial wafer 10C associated with polishing in the polishing step (S4). Further, the broken lines on the rear surface side of the adjusting wafer 11 show a thickness removal profile 14*b* of the rear surface side of the adjusting epitaxial wafer 10C associated with the polishing. In general, in polishing of an epitaxial wafer, it is likely that the polishing amount is larger in the peripheral portion than in the center portion. In this embodiment, the epitaxial film 12*a* is formed such that the surface of the epitaxial film of the adjusting epitaxial wafer 10B before polishing becomes flat, so that edge sagging occurs in the peripheral portion of the epitaxial film 13*a* after polishing.

Here, in polishing, a given double-side polishing apparatus can be used for example, chemical mechanical polishing (CMP) can be performed using a planetary gearless double-side polishing apparatus. For example, with the adjusting epitaxial wafer 10B being sandwiched between opposite surface plates of a double-side polishing apparatus with a constant pressure, both surfaces of the adjusting epitaxial wafer 10B are wholly polished by rotating the surface plates typically at approximately 5 rpm to 30 rpm for approximately 10 s to 600 s. Polishing in Embodiment 2 described later can be performed in the same manner as the above polishing.

(S5)

In the third measurement step (S5) after the polishing step (S4), the thickness profile of the adjusting epitaxial wafer 10C and the film thickness profile of the epitaxial film 13*a* after polishing are measured. The thickness profile of the adjusting epitaxial wafer 10C and the film thickness profile of the epitaxial film 13*a* are measured as in the step S3. The results of the third measurement are used in the step S6 for adjusting conditions for epitaxial growth.

(S6)

Next, conditions for epitaxial growth are adjusted using the thickness profiles and the film thickness profiles measured in the above first, second, and third measurement steps (S6). Here, an outline of the step for adjusting conditions for epitaxial growth will first be described. The details will be described later. From the results of the first to third measurements, the removal thickness profile 14*a* of the epitaxial film side of the epitaxial wafer 10C and the removal thickness profile 14*b* of the rear surface side of the epitaxial wafer 10C associated with polishing can be obtained separately. Here, conditions for epitaxial growth for obtaining an epitaxial wafer with higher flatness (that is, an epitaxial wafer with a target thickness profile) after polishing the epitaxial film will be described. As shown in FIGS. 2(D) and 2(E), an epitaxial film 22*a* is formed on the top surface of another wafer 21 (FIG. 2(D)) of the same type as the adjusting wafer 11 using different conditions for epitaxial growth, thereby obtaining an epitaxial wafer 20E having a different film thickness profile from that of the epitaxial film 12*a* (FIG. 2(E)). After that, as shown in FIG. 2(F), when the epitaxial wafer 20E is polished under the same conditions as the polishing step (S4) in this embodiment, removal thickness profiles of the epitaxial film side and the rear surface side of the epitaxial wafer 20E, removed by polishing (24*a*, 24*b*) are almost the same as the removal thickness profiles of the epitaxial film side and the rear surface side of the adjusting epitaxial wafer 10C (14*a*, 14*b*), respectively. Subsequently, conditions for epitaxial growth of the epitaxial film 22*a* are adjusted considering the previously found removal thickness profile to be removed by the subsequent polishing such that the epitaxial wafer 20F has a target thickness profile (that is, more uniform thickness profile) after polishing.

Figure 3:
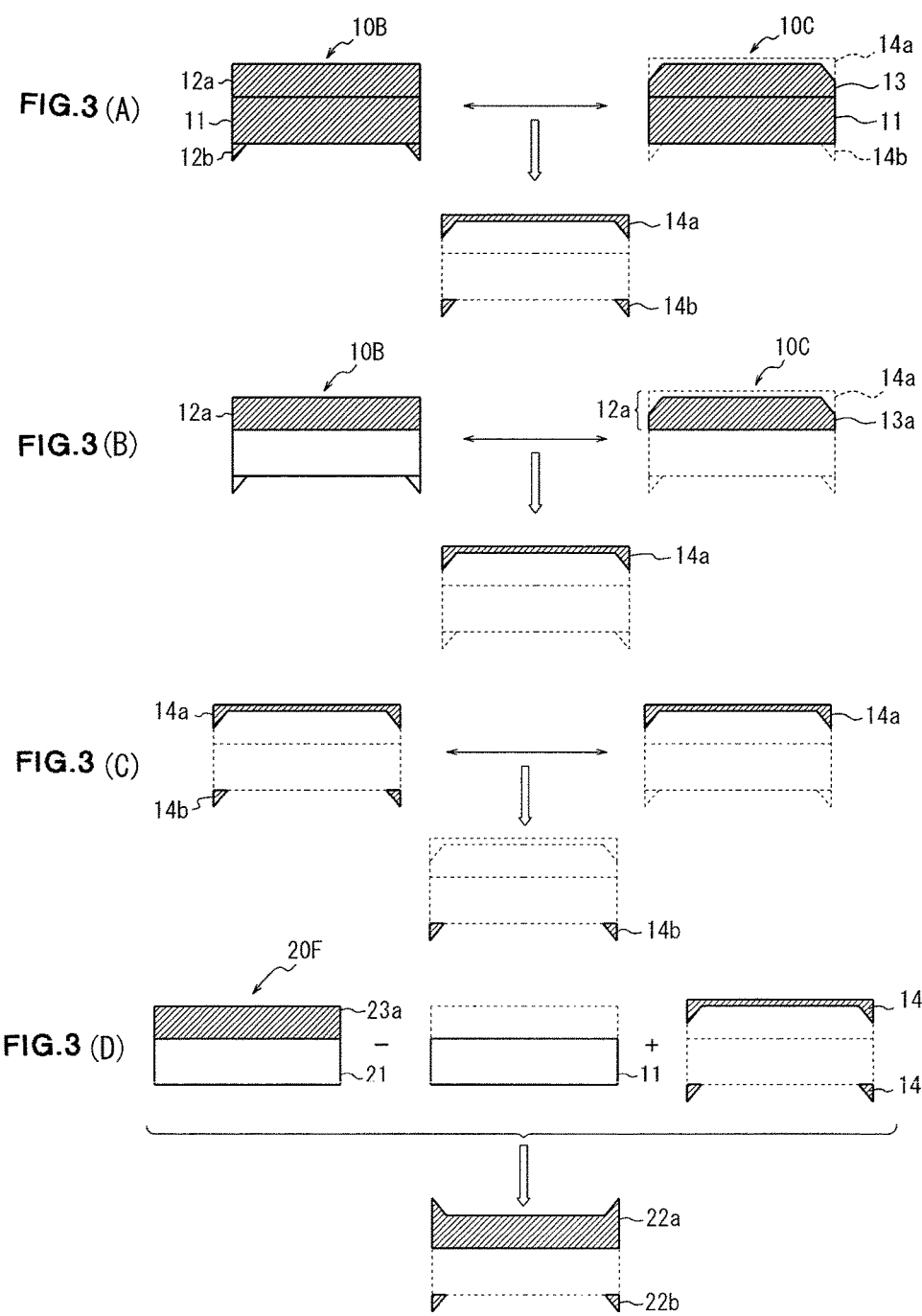
FIGS. 3(A) to 3(D) are schematic cross-sectional views illustrating the operations in adjusting conditions for epitaxial growth in a method of producing an epitaxial wafer according to Embodiment 1.

With reference to FIG. 3, the above method of adjusting conditions for epitaxial growth will be described in more detail. For the adjustment of the conditions for epitaxial growth, the following four operations are performed.

With reference to FIG. 3(A), a first operation is described. The first operation is a comparison operation performed on the thickness profile of the adjusting epitaxial wafer 10B in the second measurement step (S3) and the thickness profile of the adjusting epitaxial wafer 10C in the third measurement step (S5). Specifically, the thickness profile of the adjusting epitaxial wafer 10C is subtracted from the thickness profile of the adjusting epitaxial wafer 10B. From the comparison operations, the removal thickness profile of the adjusting epitaxial wafer associated with the polishing (S4) (corresponding to the sum of the removal thickness profiles 14a and 14b associated with the polishing (S4)) is calculated and obtained.

Next, with reference to FIG. 3(B), a second operation is described. The second operation is a comparison operation performed on the film thickness profile of the epitaxial film 12a in the second measurement step (S3) and the film thickness profile of the epitaxial film 13a in the third measurement step (S5) as in the above first comparison operation. Specifically, the film thickness profile of the epitaxial film 13a is subtracted from the film thickness profile of the epitaxial film 12a. From this comparison operation, the removal film thickness profile of the epitaxial film associated with the polishing (S4) (corresponding to the removal thickness profile 14a associated with the polishing) is calculated and obtained.

Next, as a third operation, based on the removal thickness profile (14a, 14b) and the removal film thickness profile (corresponding to the removal thickness profile 14a) obtained in the above first and second operations, the removal thickness profile (14a, 14b) of the epitaxial film side and the rear surface side of the adjusting epitaxial wafer associated with the polishing (S4) are separately calculated and obtained (FIG. 3(C)).

Finally, with reference to FIG. 3(D), a fourth operation is described. Here, conditions for epitaxial growth are adjusted based on the removal thickness profiles 14a and 14b of the epitaxial film side and the rear surface side of the adjusting epitaxial wafer, the thickness profile of the adjusting wafer 11 measured in the first measurement step, and the thickness profile of the epitaxial wafer 20F having a target thickness profile. Specifically, the thickness profile of the adjusting wafer 11 measured in the first measurement step is subtracted from the target thickness profile of the epitaxial wafer 20F, and the removal thickness profile 14a of the epitaxial film side of the adjusting epitaxial wafer is added thereto; thus, the film thickness profile of the epitaxial film 22a to be formed before polishing can be found. The conditions for epitaxial growth are adjusted thereby achieving the above film thickness profile of the epitaxial film 22a and the thickness profile of a deposit 22b expected to be formed when the epitaxial film 22a is formed, which deposit 22b corresponds to the removal thickness profile 14b of the rear surface side of the adjusting epitaxial wafer.

After the formation of the epitaxial film 22a, the epitaxial wafer 20E is polished under the same conditions as the polishing in the step S4, thereby obtaining an epitaxial wafer 20F having a target thickness profile. Thus, conditions for epitaxial growth which make it possible to obtain an epitaxial wafer with higher flatness can be adjusted using the thickness profiles and the film thickness profiles measured in the first, second, and third measurement steps.

Here, in the step S6, as a specific example of the conditions for epitaxial growth adjusted based on the results of the first to third measurement steps, parameters for adjusting the film thickness profile of the epitaxial film after the epitaxial growth is not limited in particular. For example, the parameters may include the gas flow rate of a silicon source gas, the blow time thereof, and a chamber temperature. In general, when the growth surface of the wafer is a (100) plane, the film thickness profile of the epitaxial film 22a to be formed is thicker in the peripheral portion than in the center portion as shown in FIG. 3(D). Here, when the gas flow rate of the silicon source gas is increased, the film thickness of the peripheral portion can be increased, whereas when the gas flow rate is reduced, the film thickness of the peripheral portion can be reduced. Thus, the film thickness profile of the peripheral portion of the epitaxial film 22a can be controlled with the gas flow rate of the silicon source gas. Further, when the blow time for blowing the silicon source gas is increased, the epitaxial film becomes thicker, whereas when the blow time is reduced, the epitaxial film becomes thinner. Thus, by adjusting the parameters, an epitaxial film having a given film thickness profile can be formed before polishing the epitaxial film.

As described above, in a method of adjusting conditions for epitaxial growth according to one embodiment, the shape of the removal film thickness profile associated with polishing is considered, and as a result, conditions for epitaxial growth which make it possible to obtain an epitaxial wafer with higher flatness can be adjusted.

In this embodiment, both surfaces of the epitaxial wafer are wholly polished. However, even when only at least the epitaxial film surface (that is, the top surface) of the epitaxial wafer is polished, sagging due to polishing on the peripheral portion can be suppressed by obtaining the removal thickness profile of the epitaxial wafer associated with polishing; thus, the disclosed method remains effective.

Further, in the above embodiment, both surfaces are simultaneously polished; alternatively, the surfaces may be separately polished one by one to find the removal thickness profile and the removal film thickness profile associated with the polishing. Polishing the surfaces one by one allows the shape caused by the removal by polishing, the surface roughness, and the LPDs to be controlled for one surface at a time.

Here, this disclosure can be applied to a given wafer. Specifically, this disclosure can be applied to wafers including a given wafer such as a silicon wafer, a SiC wafer, a sapphire wafer, and a compound semiconductor wafer. For the source gas for forming an epitaxial film, a given source gas can be used depending on the wafer. The crystal plane on which epitaxially growth is performed is not limited in particular. For example, this disclosure is applicable to a given crystal plane such as (100) plane, (111) plane, or (110) plane of a silicon wafer, or the like. Note that the thickness and the diameter of the wafer are not limited.

Further, conditions for epitaxial growth which make it possible to obtain an epitaxial wafer with higher flatness can be adjusted by repeating the above described steps S1 to S6 using a plurality of adjusting wafers to repeatedly adjust the conditions for epitaxial growth thereby improving the accuracy.

Embodiment 2: Method of Producing Epitaxial Wafer

Figure 4:
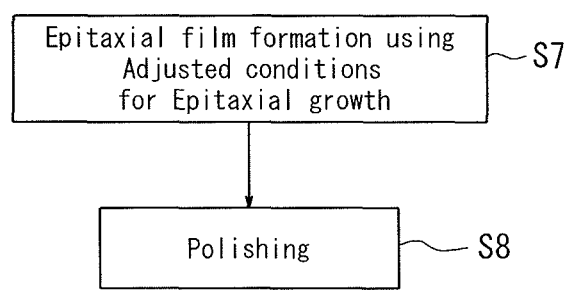
FIG. 4 is a flowchart illustrating a method of producing an epitaxial wafer according to Embodiment 2.

In a method of producing an epitaxial wafer, an epitaxial film is formed on the top surface of the adjusting wafer 11 (the wafer 21 (FIG. 2(D) of the same type as one in FIG. 2(A))) using conditions for epitaxial growth which are adjusted in Embodiment 1 (FIG. 4, S7), and the epitaxial film surface 22a on the top surface of the wafer 21 is polished under the same conditions as the polishing step (S4 in FIG. 1) in Embodiment 1 (FIG. 4, S8). Note that an epitaxial film is not formed on the wafer 21 before the formation of the epitaxial film (FIG. 4, S7).
(S7)

First, the epitaxial film 22a is formed on the top surface of the wafer 21 (FIG. 2(D)) of the same type as the adjusting wafer 11 using the conditions for epitaxial growth which are adjusted in Embodiment 1 (S7 in FIG. 4, FIG. 2(E)). At that time, the deposit 22b is also formed on the end portion of the rear surface of the wafer 21 as described in Embodiment 1.
(S8)

In subsequently polishing a surface of the epitaxial film 22a (S8 in FIG. 4), both surfaces of the epitaxial wafer 20E are polished under polishing conditions the same as those in the step S4 in Embodiment 1, thereby obtaining the epitaxial wafer 20F having a target thickness profile (FIG. 2(F)). The epitaxial wafer 20F after polishing has the wafer 21 serving as a substrate and an epitaxial film 23a formed on the top surface of the wafer. Polishing both surfaces is preferred, since the deposit 22b can be removed by the polishing. In that case, the portion indicated by the broken lines, that is, the epitaxial film 22a before polishing from which the epitaxial film 23a after polishing is removed is the thickness removal profile 24a of the epitaxial film side of the epitaxial wafer 20F, resulted from polishing, whereas the broken lines indicating where the deposit 22b is located before polishing show the thickness removal profile 24b of the rear surface side of the epitaxial wafer 20F resulted from the polishing. The thus obtained epitaxial wafer 20F can have higher flatness, since the removal thickness profile associated with the polishing (S8) is considered.

Here, as a result of adjusting conditions for epitaxial growth for forming the epitaxial film 22a, the conditions for epitaxial growth in Embodiment 1 and the conditions for epitaxial growth in this embodiment are generally different. However, when the epitaxial wafer is polished under the same polishing conditions as the polishing step (S4) in Embodiment 1, almost the same removal thickness profile of the epitaxial film side of the epitaxial wafer (14a, 24a) is obtained, and almost the same removal thicknesses profile of the rear surface side (14b, 24b) is obtained.

Note that the description that the polishing conditions for the polishing (S4) in Embodiment 1 and the polishing conditions for the polishing (S8) in this embodiment are "the same" does not exclusively refer to the case where the polishing conditions completely agree with each other. For example, the polishing time and the rotational speed of the polishing apparatus may be somewhat different between the polishing conditions as long as the removal thicknesses of the epitaxial wafers resulted from polishing are almost the same and the polishing conditions do not obstruct the intended effects.

Even if only a surface of the epitaxial film (that is, the top surface) of the epitaxial wafer is polished, the disclosed method is effective in suppressing edge sagging in the peripheral portion of the epitaxial wafer. Thus, the disclosed method is still effective. Further, as shown in FIG. 3(D) described above, the epitaxial film 22a is formed such that the peripheral portion thereof is raised (or "elevated") and conditions for epitaxial growth are adjusted such that the deposit 22b on the rear surface side can be removed by polishing. Thus, even if the surface of the epitaxial film 22a is not flat after the formation of the epitaxial film (S7), the epitaxial wafer 20F after polishing (S8) can have higher flatness.

Further, when the crystal plane of the wafer 21 to be subjected to epitaxial growth is a (110) plane, the Haze value; which is an index for the surface roughness of an epitaxial wafer, is significantly reduced; therefore, the disclosed method is particularly effective. The Haze value is determined as the ratio of the total scattered light with respect to the incident light (ppm) when surface scattered light of light (mostly laser light is used) applied to the top surface of an epitaxial wafer is measured. The Haze value can be measured by a given method. For example, SP2, a light scattering measurement system manufactured by KLA-Tencor Corporation can be used. In general, as the surface roughness is higher, the Haze value is also higher.

However, wafers to which this disclosure can be applied are not limited to wafers of which (110) crystal planes are subjected to epitaxially growth. Note that the adjusting wafer 11 and the wafer 21 are of the same type. On that occasion, this disclosure can be applied to a given wafer such as a silicon wafer having a crystal plane of (100) plane or (111) plane as described above. Further, as also described above, this disclosure is not limited to silicon wafers. For the source gas for forming an epitaxial film, a given source gas can be used depending on the wafer. Note that the thickness and the diameter of the wafer are not limited.

Here, once conditions for epitaxial growth are adjusted in Embodiment 1, the same conditions for epitaxial growth can be used in a case where an epitaxial film is formed on a wafer of the same type in this embodiment. Naturally, the conditions for epitaxial growth are not required to be adjusted using an adjusting wafer every time an epitaxial wafer is produced from a wafer of the same type.

Note that in this specification, the description that the adjusting wafer 11 and the wafer 21 are of "the same type" means that the wafer components, the diameter, the thickness, the crystal plane on which an epitaxial film is grown, and the like are the same between the wafers. However, "the same" here does not imply strict mathematical equality, and may naturally involve differences tolerated as long as the operation and effect of the disclosed method can be achieved, including unavoidable differences in the production process of a wafer. The tolerance for being "the same" in the quantitative components associated with the shape of a wafer, such as the diameter or the thickness is within ±2%. For example, if the adjusting wafer 11 and the wafer 21 have been obtained from one and the same crystal ingot through production processes under the same conditions, the wafers can be deemed to be of "the same type" defined above.

EXAMPLES

Next, in order to clarify the effects, Examples and Comparative Example are given below; however, this disclosure is not limited to those examples.

Example 1

Conditions for epitaxial growth were adjusted by the methods described above with reference to FIG. 1 to FIG. 4 and an epitaxial wafer 20F was prepared using the conditions for epitaxial growth. First, P-type silicon wafers were prepared to have a diameter of 300 mm, a thickness of 770 and a crystal plane of (110) plane on which an epitaxial film is to be formed, thereby obtaining the adjusting wafer 11 and the wafer 21.
(First Measurement)

The thickness profile of the adjusting wafer 11 was measured using WaferSight manufactured by KLA-Tencor Corporation. Here, the thickness profile was obtained as a profile of the peak-to-valley (PV) values plotted in the diameter direction. That is, the thickness profile herein means a profile of PV values in a certain direction (in the diameter direction in this example) of the thickness profile (PV values) measured for the wafer with the minimum value of the difference between PV values (maximum value− minimum value) being 0. The same applies hereinafter.

(Epitaxial Film Formation)

The adjusting wafer 11 was placed on a susceptor in a single-wafer processing epitaxial apparatus and a hydrogen gas was supplied into the chamber thereby performing hydrogen baking at a temperature of 1150° C. for 60 s. Subsequently, a silicon source gas (TCS) and a dopant gas (diborane) were supplied together with a hydrogen gas, which is a carrier gas, into the furnace, thereby performing epitaxial growth at a temperature of 1150° C. to obtain a 3 μm epitaxial film. Thus, the adjusting epitaxial wafer 10B was obtained.

(Second Measurement)

After that, the thickness profile of the adjusting epitaxial wafer 10B was measured using WaferSight manufactured by KLA-Tencor Corporation, and the film thickness profile of the adjusting epitaxial film was measured using a Fourier transform infrared spectrophotometer (FTIR).

(Polishing and Third Measurement)

Next, the adjusting epitaxial wafer 10B in which the epitaxial film 12a had been formed was rotated at a constant speed of 25 rpm using a pair of surface plates of a planetary gearless double-side polishing apparatus, thereby mirror polishing both surfaces (top surface and rear surface) of the adjusting epitaxial wafer 10B for 300 s to obtain the adjusting epitaxial wafer 10C. Non-woven cloth was used for the polishing pads and colloidal silica in which 1 weight percent of silica particles are mixed in a base of a KOH solution was used as an abrasive slurry. The thickness profile of the adjusting epitaxial wafer 10C and the film thickness profile of the epitaxial film were measured in the same manner as above.

(Adjustment of Conditions for Epitaxial Growth)

Based on the results of the first, second, and third measurements, conditions for epitaxial growth were adjusted to adjust the film thickness profile of the epitaxial film such that the thickness profile of the epitaxial wafer after epitaxial growth and before polishing results in a raised peripheral portion and the epitaxial wafer after polishing has high flatness. Specifically, the amount of adjustment on the gas flow rate of the silicon source gas (TCS) was adjusted to 10% higher. Using the above conditions for epitaxial growth, the epitaxial film 22a was formed on the wafer 21, and the epitaxial wafer 20F, was then polished under the same conditions as the polishing of the adjusting epitaxial wafer 10B, thereby obtaining the epitaxial wafer 20F.

Figure 5:
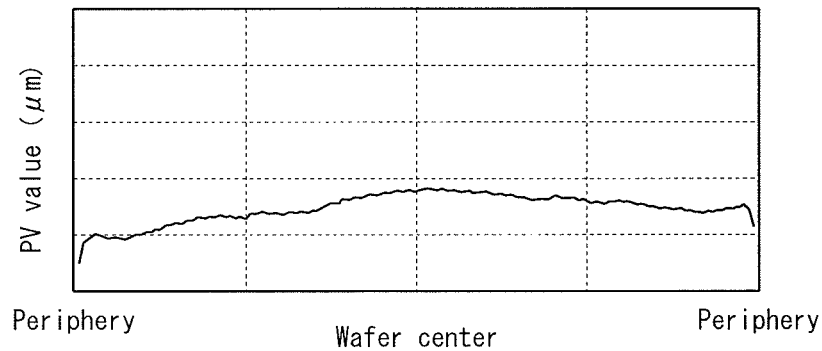
Figure 5:
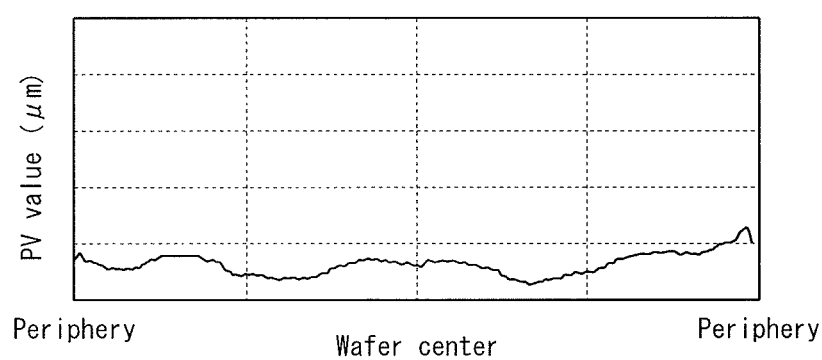
Figure 5:
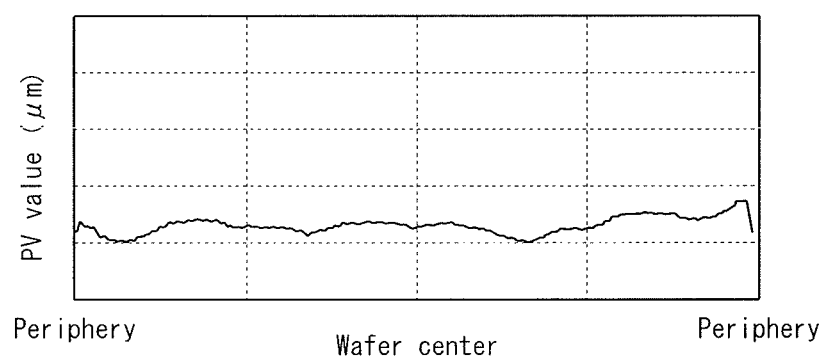

The thickness profiles of the wafer 21, the epitaxial wafer 20E, and the epitaxial wafer 20F were measured using a flatness measurement system (WaferSight manufactured by KLA-Tencor). The measurement results in Example 1 are shown in FIGS. 5(A) to 5(C). FIG. 5(A) shows the thickness profile of the wafer 21, FIG. 5(B) shows the thickness profile of the epitaxial wafer 20E, and FIG. 5(C) shows the thickness profile of the epitaxial wafer 20F using the relative value.

Further, the SFQRmax (site size: 26×8 mm$^2$) of the obtained epitaxial wafer 20F was measured using a flatness measurement system (WaferSight manufactured by KLA-Tencor), and the Haze value of a surface of the epitaxial film was measured using a light scattering measurement system, SP2 of KLA-Tencor Corporation in DWO mode (darkfield wide oblique mode). The results are shown in Table 1.

Here, the SFQR (Site Front least sQuares Range) is an index of the flatness of a wafer conforming to the SEMI standard. The SFQR is specifically found by obtaining a plurality of rectangular samples having a predetermined size from the wafer and calculating the sum of the absolute values of the maximum amounts of displacement from the reference planes of the obtained samples found by the least square method. Accordingly, a smaller SFQR indicates higher flatness.

Example 2

Figure 6:
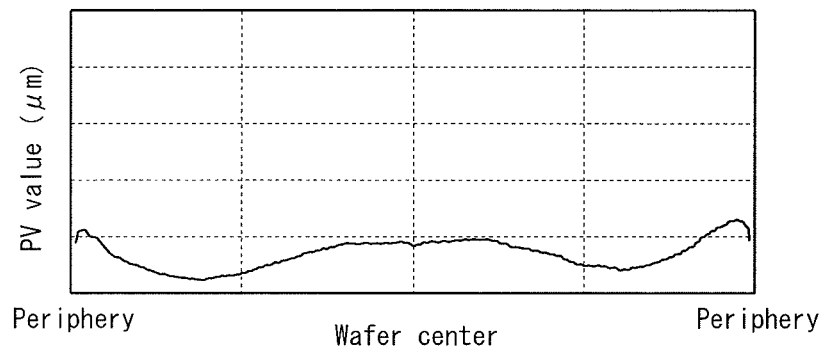
Figure 6:
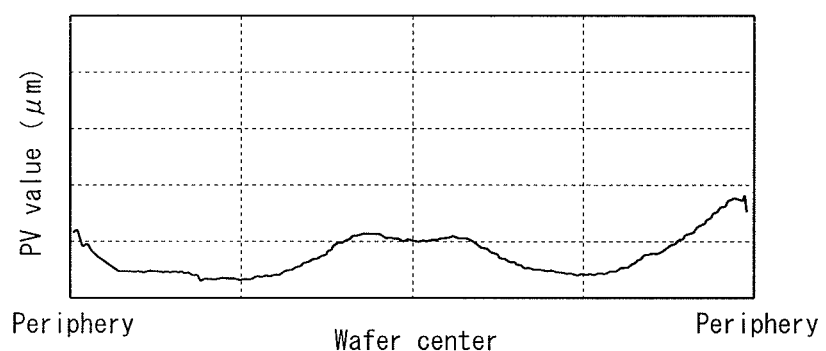
Figure 6:
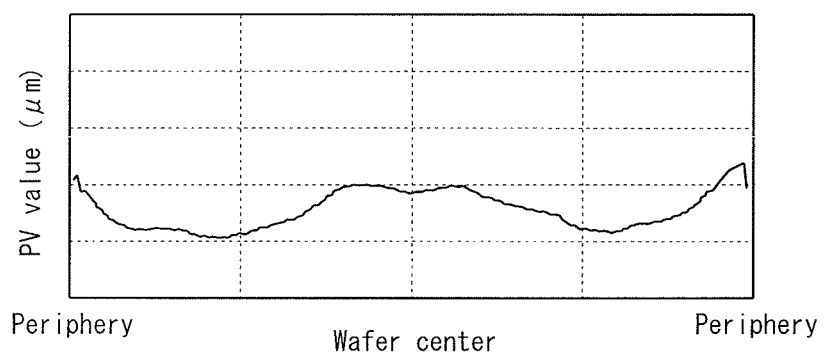

Conditions for epitaxial growth were adjusted in the same manner as Example 1 except that a wafer having the thickness profile shown in FIG. 6(A) (different from the thickness profile in Example 1, the thickness of the wafer was smaller in an intermediate portion between the peripheral portion of the wafer and the center of the wafer in the diameter direction) was used as the adjusting wafer 11. Based on the measurement results obtained by the first, second, and third measurements, in the conditions for epitaxial growth in Example 2, a gas flow rate of the silicon source gas (TCS) is reduced by 7% from that in the conditions for epitaxial growth after the adjustment in Example 1. Further, using the conditions for epitaxial growth, the epitaxial wafer 20F of Example 2 was obtained. The thickness profile of the wafer 21, the thickness profile of the epitaxial wafer 20E, and the thickness profile of the epitaxial wafer 20F were measured in the same manner as Example 1. Subsequently, the SFQRmax of the epitaxial wafer 20F and the Haze value of a surface of the epitaxial film were measured. The results are shown in FIGS. 6(A) to 6(C) and Table 1 as with Example 1.

Comparative Example

Figure 7:
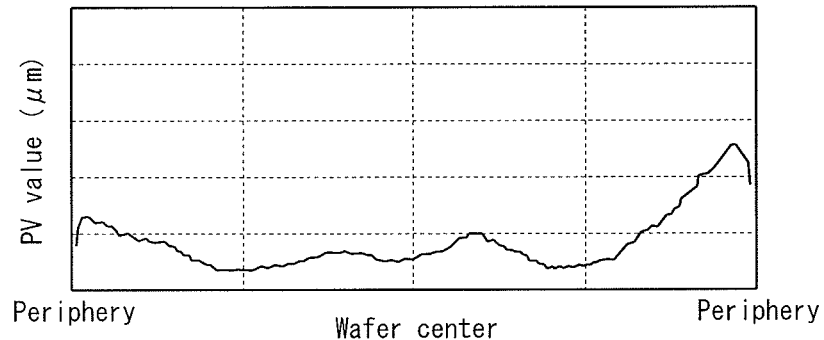
Figure 7:
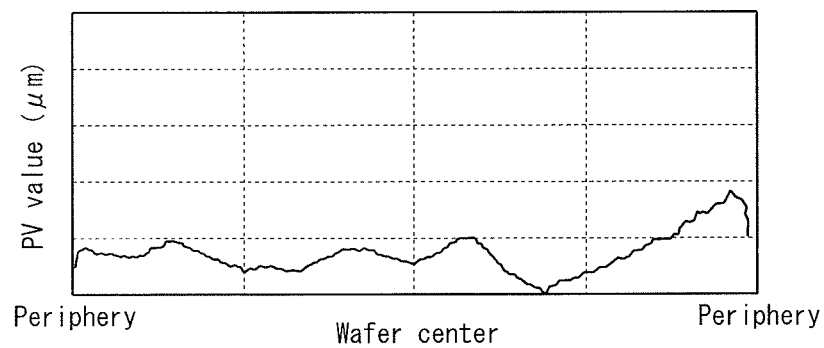
Figure 7:
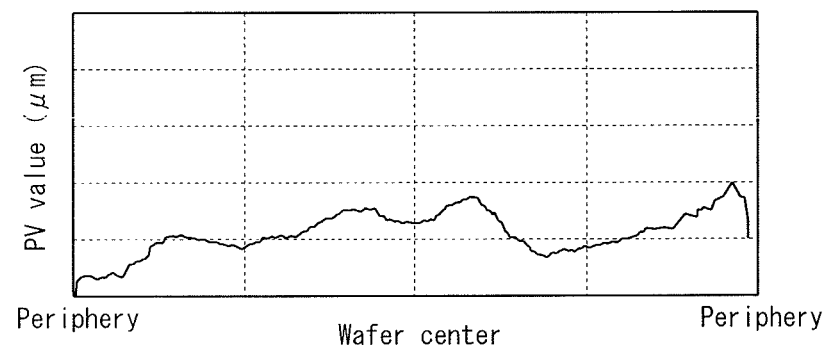

Using a wafer having the thickness profile shown in FIG. 7(A) (as is clear from the drawings, the wafer had a different thickness profile from ones in Example 1 and Example 2), an epitaxial film was formed under the conditions for epitaxial growth before the adjustment of the epitaxial growth in Example 1, and the epitaxial film was polished under the same conditions as Example 1, thereby obtaining an epitaxial wafer. The thickness profiles corresponding to the thickness profiles of the wafer and the epitaxial wafer measured in the first, second, and third measurements in Example 1 are shown in FIGS. 7(A) to 7(C), respectively as with Example 1. Subsequently, the SFQRmax of the epitaxial wafer 20F and the Haze value of a surface of the epitaxial film were measured. The results are shown in Table 1.

TABLE 1

| | SFQR max (μm) | Haze value (DWO mode) (ppm) |
| --- | --- | --- |
| Example 1 | 0.027 | 0.14 |
| Example 2 | 0.027 | 0.14 |
| Comparative Example | 0.050 | 0.28 |

FIG. 5(C), FIG. 6(C), and FIG. 7(C) show that polishing sagging in the peripheral portion due to polishing after the formation of the epitaxial film is suppressed more in Examples 1 and 2 as compared with Comparative Example.

Further, Table 1 shows that the SFQR is lower and the flatness is higher in Examples 1 and 2 as compared with Comparative Example. Table 1 also shows that the Haze value is lower and the surface roughness is lower in Examples 1 and 2 as compared with Comparative Example. This demonstrates that an epitaxial wafer having high flatness with reduced surface roughness can be obtained by the disclosed method of producing an epitaxial wafer. This is attributed to that different from Examples 1 and 2, the conditions for epitaxial growth were not adjusted with respect to the thickness profile of the wafer in Comparative Example. In fact, the SFQRmax which is an index for the flatness after polishing was worse than in Examples 1 and 2. Thus, the disclosed method for adjusting conditions for epitaxial growth has been found to allow conditions for epitaxial growth to be adjusted to obtain an epitaxial wafer with higher flatness.

INDUSTRIAL APPLICABILITY

We can provide a method of adjusting conditions for epitaxial growth which makes it possible to obtain an epitaxial wafer with higher flatness by considering a removal film thickness profile of an epitaxial film associated with polishing. Further, we can provide a method of producing an epitaxial wafer, by which sagging of the epitaxial wafer caused by polishing after the polishing of the epitaxial wafer after the formation of the epitaxial film is suppressed using the conditions for epitaxial growth that have been adjusted by the disclosed adjusting method, thereby obtaining an epitaxial wafer with higher flatness.

REFERENCE SIGNS LIST

10B: Adjusting epitaxial wafer before polishing
10C: Adjusting epitaxial wafer after polishing
11: Adjusting wafer
12a: Epitaxial film
12b: Deposit on end portion of rear surface of Wafer
13a: Epitaxial film after polishing
14a: Removal thickness profile of top surface side of Adjusting epitaxial wafer associated with polishing
14b: Removal thickness profile of rear surface side of Adjusting epitaxial wafer associated with polishing
20E: Epitaxial wafer before polishing
20F: Epitaxial wafer after polishing
21: Wafer
22a: Epitaxial film
22b: Deposit on end portion of rear surface
23a: Epitaxial film after polishing
24a: Removal thickness profile of top surface side of Epitaxial wafer associated with polishing
24b: Removal thickness profile of rear surface side of Epitaxial wafer associated with polishing

The invention claimed is:

1. A method of adjusting conditions for obtaining an epitaxial wafer, the method comprising:
(A) measuring a thickness profile of an adjusting wafer with a flatness measurement system before an epitaxial film is formed on a top surface of the adjusting wafer;
(B) forming an epitaxial film on the top surface of the adjusting wafer to form an adjusting epitaxial wafer;
(C) measuring a thickness profile of the adjusting epitaxial wafer with the flatness measurement system and a film thickness profile of the epitaxial film with a Fourier transform infrared spectrophotometer after forming the epitaxial film and before polishing the adjusting epitaxial wafer;
(D) simultaneously polishing a surface of the epitaxial film and a rear surface of the epitaxial wafer after the measuring of (C) to form a polished adjusting epitaxial wafer;
(E) measuring a thickness profile of the polished adjusting epitaxial wafer with the flatness measurement system and a film thickness profile of the epitaxial film with a Fourier transform infrared spectrophotometer after the polishing of (D);
(F) adjusting conditions for forming an epitaxial film on a top surface of an other wafer of the same type as the adjusting wafer using the thickness profiles and the film thickness profiles measured in (A), (C), and (E); and
(G) forming an epitaxial film on the top surface of the other wafer using the adjusted conditions of (F) to obtain an epitaxial wafer having a different epitaxial film thickness profile than the film thickness profile of the epitaxial film measured in (C).

2. The method of claim 1, wherein adjusting conditions for forming an epitaxial film on a top surface of an other wafer of (F) comprises:
calculating a removal thickness profile of the epitaxial wafer associated with the polishing by comparing the thickness profile measured in (C) with the thickness profile measured in (E);
calculating a removal film thickness profile of the epitaxial film associated with the polishing by comparing the film thickness profile measured in (C) with the film thickness profile measured in (E);
calculating a removal thickness profile of the epitaxial film side of the epitaxial wafer and a removal thickness profile of the rear surface side of the epitaxial wafer associated with polishing based on the calculated removal thickness profile and the calculated removal film thickness profile; and
adjusting the conditions for epitaxial growth based at least on the removal thickness profile of the epitaxial film side of the epitaxial wafer associated with the polishing and the thickness profile of the wafer before the formation of the epitaxial film, whereby obtaining an epitaxial wafer having a target thickness profile after the polishing step.

3. The method of claim 1, wherein adjusting conditions for forming an epitaxial film on a top surface of an other wafer of (F) comprises adjusting the film thickness profile of the epitaxial film.

4. A method of producing an epitaxial wafer, comprising:
forming an epitaxial film on a top surface of a wafer to form an epitaxial wafer based on an adjusted condition by the adjusting method of claim 1; and
polishing a surface of the epitaxial film on the top surface of the epitaxial wafer under the polishing conditions used to polish the surface of the epitaxial film to form the polished adjusting epitaxial wafer in (D).

5. The method of claim 4, wherein:
the forming of the epitaxial film of (B) is performed on a (110) plane of the adjusting wafer; and
the forming of the epitaxial film on the top surface of the wafer to form the epitaxial wafer based on the adjusted condition is performed on a (110) plane of the wafer.

6. The method of claim 3, wherein the film thickness profile of the epitaxial film is adjusted such that the thickness profile of the epitaxial wafer after the forming of the epitaxial film of (G) and before polishing comprises a raised peripheral portion.

7. The method of claim 1, wherein a deposit on an end portion of a rear surface of the adjusting epitaxial wafer is removed by the polishing in (D).

\* \* \* \* \*